United States Patent [19]
Hotta et al.

[11] Patent Number: 5,280,442
[45] Date of Patent: Jan. 18, 1994

[54] READ-ONLY MEMORY

[75] Inventors: Yasuhiro Hotta; Mikiro Okada, both of Nara, Japan

[73] Assignee: Sharp Kabushiki Kaisha, Osaka, Japan

[21] Appl. No.: 781,630

[22] Filed: Oct. 22, 1991

[30] Foreign Application Priority Data

Oct. 22, 1990 [JP] Japan .................................. 2-285594

[51] Int. Cl.[5] .............................................. G11C 11/40
[52] U.S. Cl. ......................................... 365/63; 365/94; 365/103
[58] Field of Search ..................... 365/230.06, 230.03, 365/104, 189.01, 51, 103, 63, 94; 237/907

[56] References Cited

U.S. PATENT DOCUMENTS

| | | | |
|---|---|---|---|
| 4,970,685 | 11/1990 | Koyanagi | 365/51 |
| 5,111,428 | 5/1992 | Liang et al. | 365/51 |

FOREIGN PATENT DOCUMENTS

0068645  1/1983  European Pat. Off.

OTHER PUBLICATIONS

Nakahara et al., *International Conference on Wafer Scale Integration*, (Jan. 23-25, 1990) 1990:57-59.

Yamada et al., *IEEE Journal of Solid-State Circuits* (Feb. 1988) 23(1):20-26.

Primary Examiner—Eugene R. LaRoche
Assistant Examiner—Vu A. Le
Attorney, Agent, or Firm—Morrison & Foerster

[57] ABSTRACT

A read-only memory includes columns of memory cell arrays, a plurality of banks formed by dividing each column of the memory cell arrays along the columns, sub-bit lines disposed between adjacent banks situated along the rows and connected to a transistor of each memory cell, and main-bit lines disposed between every two other columns of the memory cell arrays and extending along the columns, wherein the sub-bit lines are divided into sets of three sub-bit lines connected to a pair of adjacent banks situated along the rows, and one end of each center sub-bit line being connected to a first main-bit line through a first selector transistor, the first main-bit line passing through one side of the set to which the center bit-line belongs, and the other end of the sub-bit line being connected to a second main-bit line through a second selector transistor, the second main-bit line passing through the other side of the set to which the center sub-bit line belongs, the two outer sub-bit lines being directly connected to the main-bit lines adjacent to the set of banks, respectively.

3 Claims, 5 Drawing Sheets

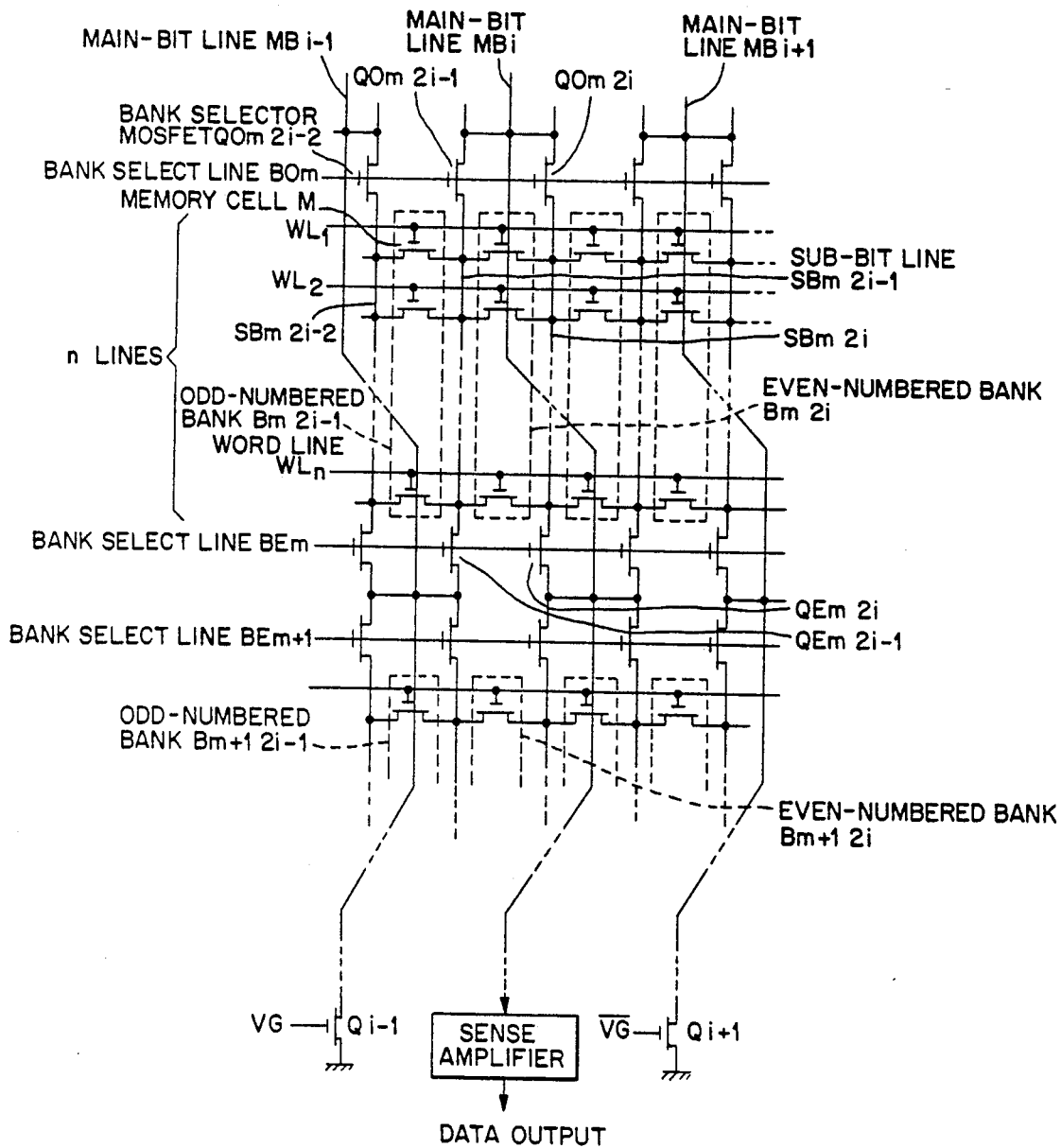

READ-ONLY MEMORY

BACKGROUND OF THE INVENTION

1. Field of the Invention

The present invention relates to a semiconductor memory, and more particularly to a semiconductor memory capable of rapid and stable operation by stepping up a current.

2. Description of Prior Art

An ordinary type of a ROM (read-only memory), (hereinafter called the "ordinary type ROM") has an equivalent circuit as shown in FIG. 5. This ROM has memory cells M consisting of MOSFETs located in a matrix, connected to word lines WL1, WL2, . . . and WLM extending along the rows through gates of each memory cell M, and connected to bit lines B1, B2, B3, . . . , Bi and Bi+1 extending along the columns through sources s and drains d. A source and a drain of adjacent memory cells are connected to a bit line consisting of a diffused layer so as to reduce the chip area.

For example, to read the memory cell M shown by the arrow in FIG. 5, the bit line B2 is connected to a sense amplifier (not shown) with the word line WL1 kept at a high level and the bit line B1 at a ground level. Thus, data 1 or 0 is read when the memory cell M is turned on or off, respectively.

A disadvantage of this ordinary type ROM is that the diffused resistor of a bit line depends greatly upon the position of the memory cell M in the memory cell array, therefore, a discharge current in reading is unstable, which slows the reading speed. All the junction capacitances of the memory cells aligned along the columns are equal to the parasitic capacitance of the bit lines, which also slows the reading speed, thereby increasing of the number of memory cells connected to bit lines.

Recently a ROM having a parasitic capacitance decreased by dividing the memory cell arrays into plural banks as shown in FIG. 6 (hereinafter called the "bank type ROM") has been proposed. In this ROM, banks Bm 2i−1, Bm+1 2i−1, . . . and Bm 2i, Bm+1 2i, . . . shown in broken lines in FIG. 6 are constructed by dividing every column of the memory cell arrays along the columns. Sub-bit lines SBm 2i−2, SBm 2i−1, SBm 2i, . . . consisting of diffused layers are disposed between the adjacent banks, and each of sub-bit lines is connected to the memory cell M in each bank in the same manner as the bit lines of the ordinary type ROM shown in FIG. 5. These sub-bit lines are also connected to the main-bit lines MBi−1, MBi,. . . extending along the columns via bank selector transistor MOSFETs (transfer gate transistors) QOm 2i−2, QOm 2i−1, QOm 2i, . . . The main bit line consists of a metal layer with low-resistance, and two sub-bit lines are connected together to one main-bit line.

For example, to select the first memory cell M which belongs to the odd-numbered bank Bm 2i−1, the main-bit line MBi−1 is grounded and the main-bit line MBi is connected to a sense amplifier. The bank selection signal indicating the selection of the bank Bm 2i−1 is kept on a high level, with the bank selection MOSFETs QOm 2i−2 and QOm 2i−1 on, and the sub-bit lines SBm 2i−2 and SBm 2i−1 is connected to the main-bit lines MBi−1 and MBi, respectively. Then data in the memory cell M is read with the word line WL1 on a high level. In this way, the bit lines are constructed with the main-bit lines and sub-bit lines, and the route of a diffused layer (the sub-bit line) is divided along the columns so as to decrease wiring-resistance of a bit line. Therefore, a discharge current is stepped up enough to effect a high speed read operation. The bit lines can have a reduced parasitic capacitance, and as a result, the memory capacity is increased because of the increased junction capacitance of the memory cell M in every column divided in the direction of columns.

However, in a conventional bank type ROM, as shown in FIG. 4, the memory is read through three MOSFETs, that is, the memory cell M and two bank selection MOSFETs QOm 2i−2 and QOm 2i−1. Therefore, the on-resistance of the transistor is more increased than in the ordinary type ROM having a single memory cell M on the discharge route, thereby increasing the whole resistance although the diffused resistance (resistance $r_1$) of a bit line is small. Thus the discharge current becomes small for reading. Accordingly, the read operation slows down.

SUMMARY OF THE INVENTION

The ROM of this invention, which overcomes the above-discussed and numerous other disadvantages and deficiencies of the prior art, comprises columns of memory cell arrays, a plurality of banks formed by dividing each column of the memory cell arrays along the columns, sub-bit lines disposed between adjacent banks situated along rows and connected to a transistor of the memory cell in each of the adjacent banks, and main-bit lines disposed between every two other columns of the memory cell arrays and extending along the columns, wherein the sub-bit lines are divided into sets of three sub-bit lines connected to a pair of adjacent banks situated along the rows, and one end of each center sub-bit line being connected to a first main-bit line through a first selector transistor, the first main-bit line passing through one side of the set to which the center bit-line belongs, and the other end of the sub-bit line being connected to a second mainbit line through a second selector transistor, the second main-bit line passing through the other side of the set to which the center sub-bit line belongs, the two outer sub-bit lines being directly connected to the main-bit lines adjacent to the set of banks, respectively, whereby in selecting a particular memory transistor of the set of banks, the first selector transistor is turned off and the second selector transistor is turned on, and in selecting a particular memory transistor belonging to the other side of the set of banks, the first selector transistor is turned on and the second selector transistor is turned off.

Suppose that one of the paired banks is a first bank and the other is a second bank. When a particular memory transistor to be read belongs to the first bank, the first selector transistor is turned off and the second selector transistor is turned on. In this way, a discharge route is formed which starts from the main-bit line of the second bank through the second selector transistor which is on, the center sub-bit line, the memory transistor, the sub-bit line of the first bank and finally the main-bit line thereof.

On the other hand, when a particular memory transistor belongs to the second bank, the first selector transistor is turned on and the second selector transistor is turned off. Thus a discharge route is formed which starts from the main-bit line of the second bank through the sub-bit line thereof, the memory transistor, the center sub-bit line, the first selector transistor which is on and the sub-bit line of the first bank, and finally the main-bit line thereof.

In either case, the discharge route has only two transistors, that is, the memory transistor to be read and the first or the second selector transistor. This increases the discharge current for reading as compared with the known bank type ROMs, thereby speeding up the read operation. The large discharge current also makes S/N ratio larger, thereby allowing a stable operation in a wider range.

Because of the use of the bank system in the ROM, the parasitic capacitance of bit lines is advantageously reduced as compared with the conventional ordinary type ROM, thereby enhancing the memory capacitance.

Thus, the invention described herein makes possible the objective of providing a read-only memory operating stably at a high speed, in which the bank system obtains a large memory capacitance and a discharge current running through bit lines when reading can be increased.

BRIEF DESCRIPTION OF THE DRAWINGS

This invention may be better understood and its numerous objects and advantages will become apparent to those skilled in the art by reference to the accompanying drawings as follows:

FIG. 6 shows an equivalent circuit of a conventional bank type ROM.

DESCRIPTION OF PREFERRED EMBODIMENTS

Figure 1:
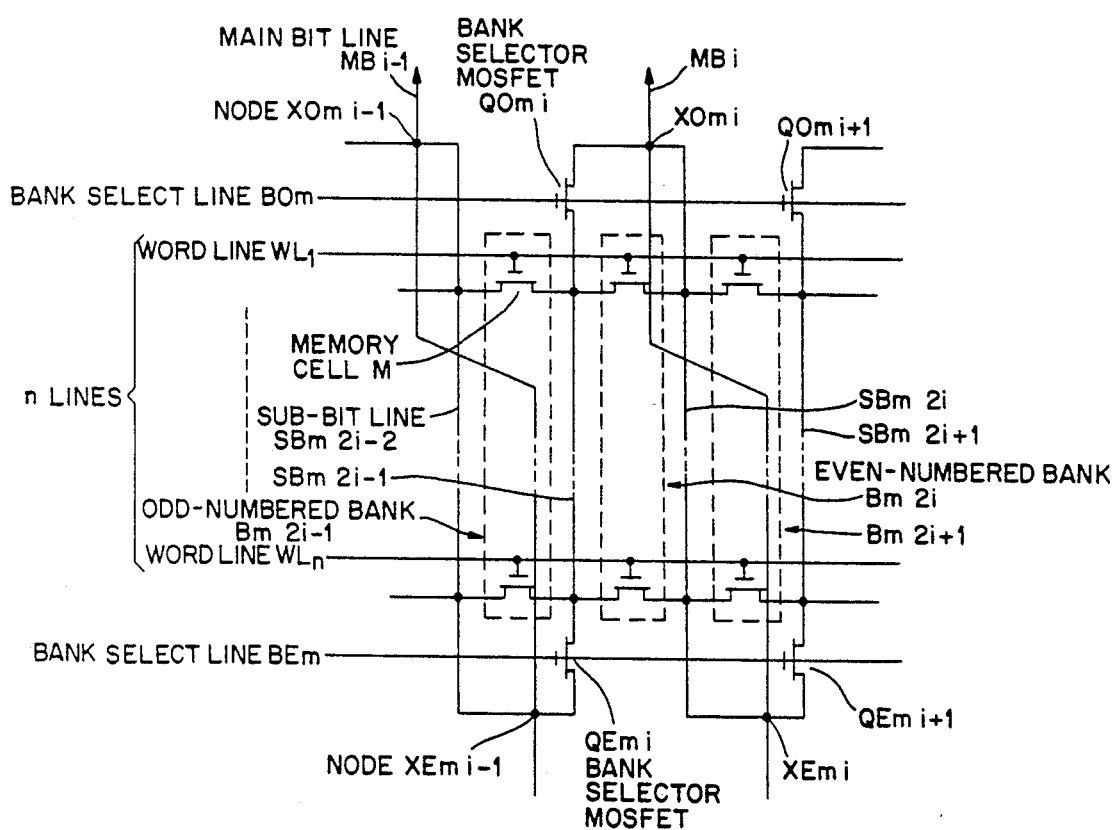
FIGS. 1 and 2 are pattern layouts of an equivalent circuit of a mask ROM of this invention.

Referring to FIG. 1, the ROM of this invention has banks shown with break lines Bm 2i−1, Bm 2i, Bm 2i+1 . . . divided from each column of the memory cell arrays in a matrix running along the columns. The division of the memory cell arrays increases the memory capacitance as compared with the conventional bank type ROM.

The signs Bm and Bi mean that the bank B is located on the mth line and the ith column, and a number of banks besides the above bank B not shown in the drawing are aligned along both lines and columns.

A set of banks consists of an odd-numbered bank and an even-numbered bank, for example, the bank Bm 2i−1 and the bank Bm 2i. Sub-bit lines SBm 2i−2, SBm 2i−1, SBm 2i, SBm 2i+1 . . . are disposed between the adjacent banks situated in the direction of the rows, and each sub-bit line SB is connected to each memory cell M (which consists of MOSFETs and is selected by word lines WL1, . . . and WLn) in the adjacent banks B. The memory cell array of every two columns has main-bit lines MBi−1 MBi, . . . extending along the columns. The main-bit lines MBi−1 and MBi respectively run on the left side and the right side of the set of banks Bm 2i−1 and Bm 2i which are respectively situated adjacent to each other along the rows.

The lower end of the center sub-bit line SBm 2i−1 among the three bit-lines which lead to the set of banks Bm 2i−1 and Bm 2i is connected to the left mainbit line MBi−1 via a bank selector MOSFET QEm i at a node XEm i−1, and the upper end of the sub-bit line SBm 2i−1 is connected to the right main-bit line MBi via a bank selector MOSFET QOm i at a node XOm i. The bank selector MOSFETs QEm i and QOm i are activated by the bank select lines BEm and BOm, respectively. The upper end and the lower end of the left sub-bit line SBm 2i−2 in the set of banks Bm 2i−1 and Bm 2i are connected to the left main-bit line MBi−1 at nodes XOm i−1 and XEm i−1 respectively. The upper end and the lower end of the right sub-bit line SBm 2i are connected to the right main-bit line MBi at nodes XOm i and XEm i. The three sub-bit lines linked to other sets of banks are also connected to the main-bit lines adjacent to each set in the same manner.

Figure 2:
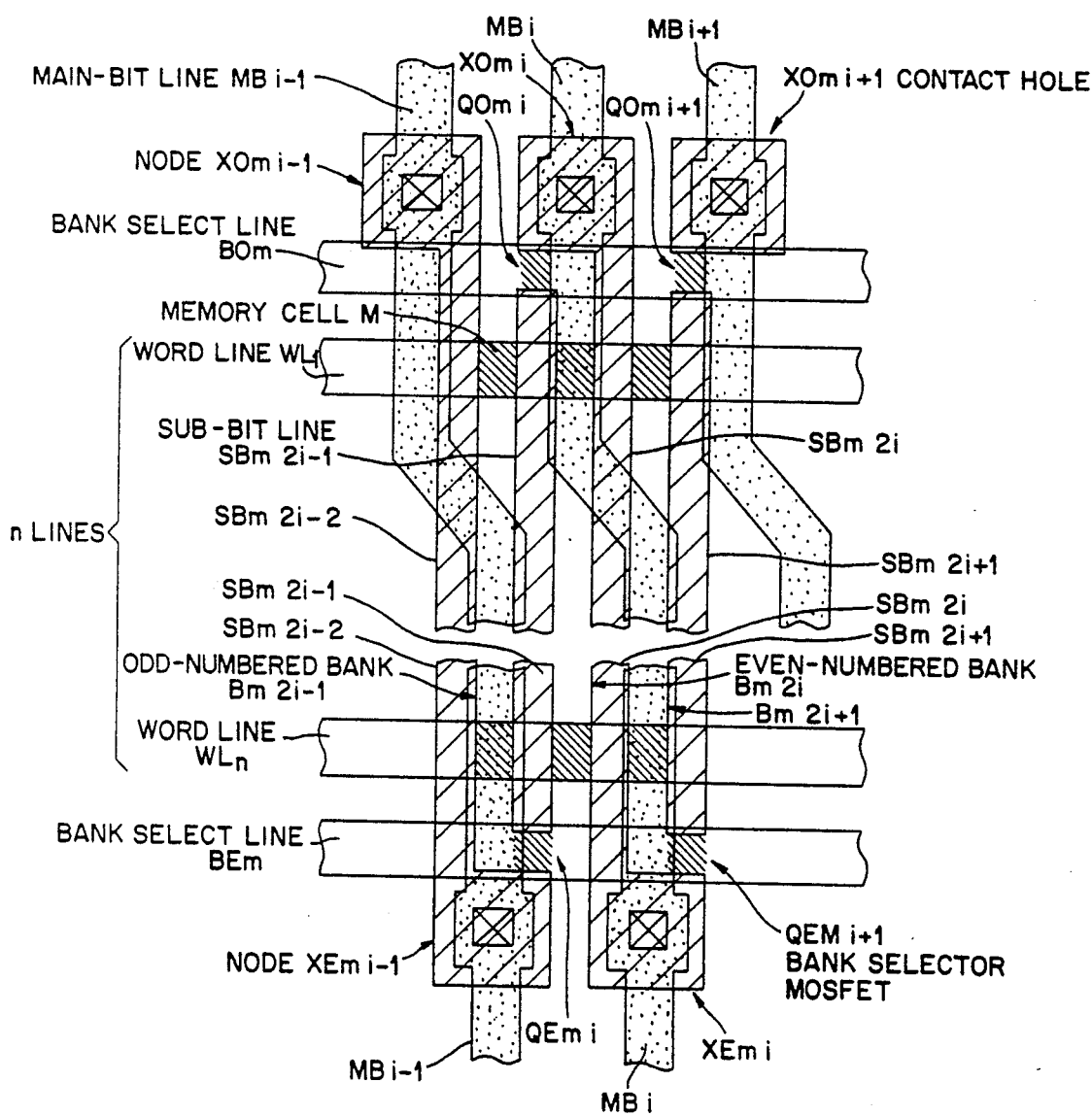

The ROM consists of a pattern in which an equivalent circuit is precisely laid out as shown in FIG. 2. The sub-bit lines SB and the nodes XO and XE are formed with diffused layers, the word lines WL and bank select lines BO and BE with polysilicon layers, and the main bit-lines MB with metal layers. Every memory cell M is formed under the word lines WL between the sub-bit lines situated adjacent to each other along the rows. The bank selector MOSFETs QO and QE are formed between a diffused portion of the nodes XO and XE and the upper and lower ends of sub-bit lines SB, respectively. The diffused layers and the metal layers (main-bit lines MB) are connected through contact holes above each node XO and XE.

The reading of this ROM is operated as follows:

Data to be read is in the memory cell M which belongs to the odd-numbered bank Bm 2i−1 in FIG. 1. The bank selector MOSFET QOm i is turned on and the bank selector MOSFET QEm i is turned off, thereby activating the bank select line BOm and deactivating the bank select line BEm, and the word line WLj (j=1, . . . , and n) leading to the memory cell M is activated. In this way a discharge route is formed which starts from the main-bit line MBi through the node XOm i, the bank selector MOSFET QOm i which is on, the sub-bit line SBm 2i−1, the memory cell M and after this forks upward and downward on the way to the sub-bit line SBm 2i−2, passing through nodes XOm i−1 and XEm i−1, respectively, reaching the main-bit line MBi−1.

In order to read the data in the memory cell M which belongs to the even-numbered bank Bm 2i in FIG. 1, the bank selector MOSFET QOm i is turned off and the bank selector MOSFET QEm i is turned on, thereby deactivating the bank select line BOm and activating the bank select line BEm. This forms discharge routes which start from the main-bit line MBi through the nodes XOm i and XEm i respectively. The discharge routes flow upward and downward of the sub-bit line SBm 2i, respectively, joining on the way to the sub-bit line SBm 2i, run through the memory cell M, the sub-bit line SBm 2i−1, the bank selector MOSFET which is on, the node XEm i−1, and reach the main-bit line MBi−1.

Figure 3:
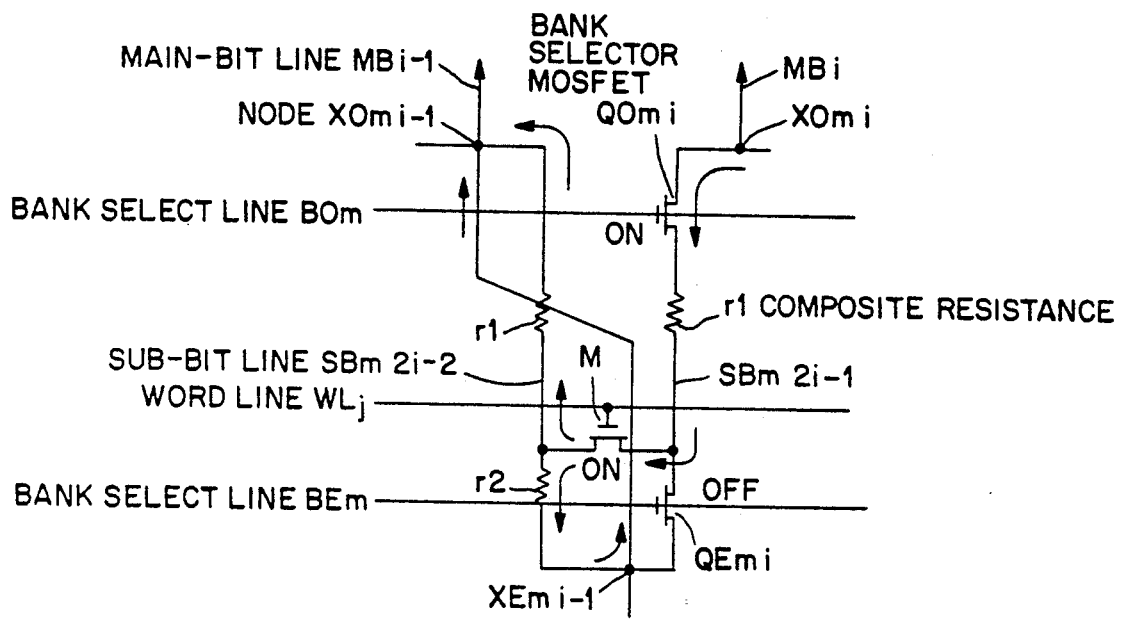
FIG. 3 is a circuit diagram exemplifying the operations of the mask ROM.
Figure 4:
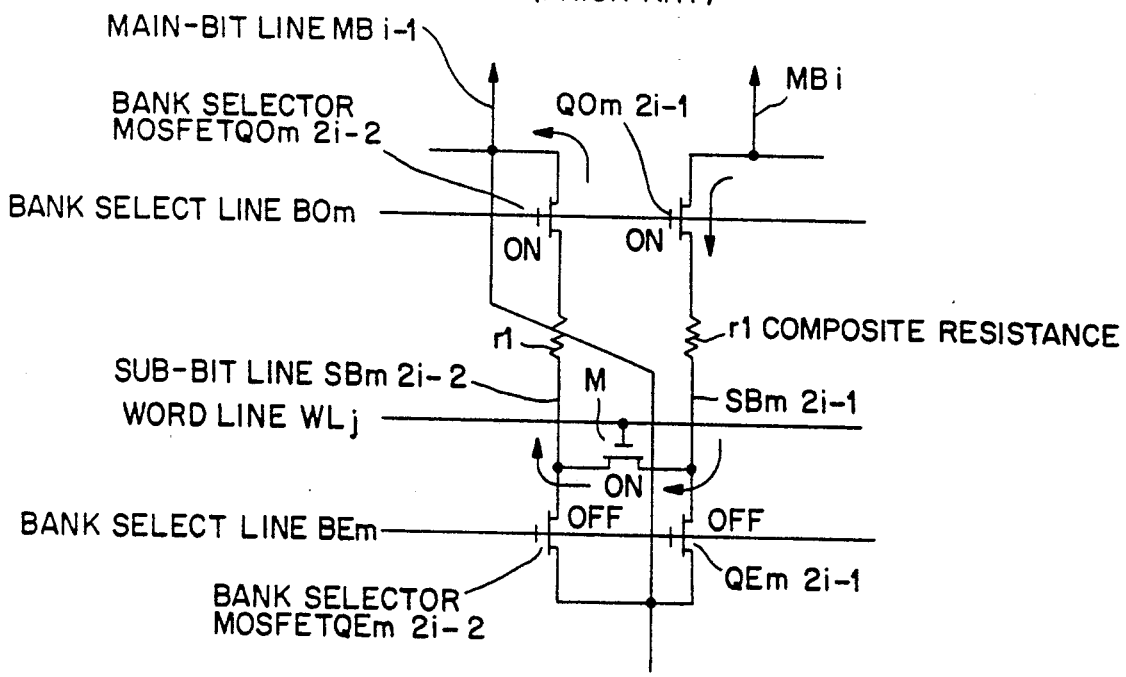
FIG. 4 is a circuit diagram exemplifying the operations of a conventional bank type ROM.
Figure 5:
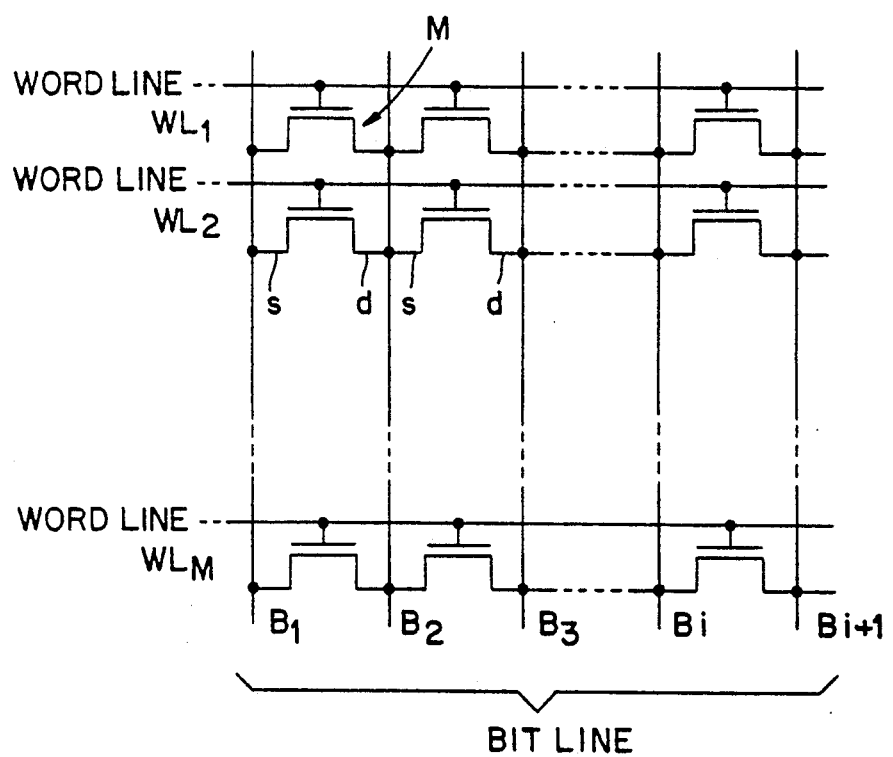
FIG. 5 shows an equivalent circuit of a conventional ordinary type ROM.

In forming a discharge route as referred to above where the memory cell which belongs to an odd-numbered bank Bm 2i−1 is assigned as shown in FIG. 3, it is possible to have only two transistors, that is the memory cell M and the bank selector MOSFET QOm i on the discharge route. Moreover, the route of the sub-bit line SBm 2i−1 can be divided into two systems thereby decreasing the diffused resistance less than in the ordinary bank type ROM (Composite resistance $r_1$, $r_2/(r_1+r_2)<r_1$). In the same way, when the memory cell which belongs to an even-numbered bank Bm 2i is assigned, it is also possible to have only two transistors, that is the memory cell M and the bank selector MOSFET QEm i on the discharge route and the route of the sub-bit line SBm 2i can be divided into two systems in the same manner as above. Therefore, whether the memory cell belongs to an odd-numbered bank Bm 2i−1 or an even-numbered bank Bm 2i, a discharge current in reading becomes larger than in the conventional bank system ROM (which has three transistors on the discharge route), thereby increasing the reading speed. The larger discharge current and the larger S/N ratio results in a wider operation margin and a stable operation.

In the illustrated examples, the mask ROM has been described as an example. However, it goes without saying that this invention can also be applied to every ROM with a memory cell array in a matrix such as EP (Erasable Programmable) ROM and E$^2$P (Electrically Erasable Programmable) ROM.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A read-only memory device comprising columns of memory cell arrays, a plurality of adjacent banks formed in rows by dividing each of said columns of the memory cell arrays along the length of said columns, sub-bit lines disposed between adjacent banks and connected to a transistor of each memory cell in each of the adjacent banks, main-bit lines disposed between every other two columns of the memory cell arrays and extending parallel to the columns, wherein the sub-bit lines are divided into sets of three sub-bit lines connected to a pair of adjacent banks in a common row, said sets of three sub-bit lines comprising a center sub-bit line and two laterally opposite outer sub-bit lines, one end of each said center sub-bit line being connected to a first main-bit line through a first selector transistor, and an other end of the center sub-bit line being connected to a second main-bit line through a second selector transistor, both ends of one of the two laterally opposite outer sub-bit lines being connected directly to the first main-bit line, and both ends of the other one of the two laterally opposite outer sub-bit lines being connected directly to the second main-bit line, whereby in selecting a particular memory transistor of one of said pair of adjacent banks, the first selector transistor is turned off and the second selector transistor is turned on, and in selecting a particular memory transistor belonging to an opposite side of said pair of adjacent banks, the first selector transistor is turned on and the second selector transistor is turned off.

2. A read-only memory device according to claim 1, wherein the sub-bit lines, and connecting nodes of the main-bit lines and the sub-bit lines are both formed with a diffused layer, and bank select lines, and word lines for selecting a memory cell are formed with polysilicon layers, and the main-bit lines are formed with metal.

3. A read-only memory device according to claim 2, wherein the first and the second selector transistors are MOSFET devices disposed between nodes of the diffused layer and both ends of the center sub-bit line.

* * * * *